(12) United States Patent
Mikoshiba et al.

(10) Patent No.: US 7,276,706 B2
(45) Date of Patent: Oct. 2, 2007

(54) RADIATION DETECTOR

(75) Inventors: Yoshiko Mikoshiba, Yamato (JP); Hiroshi Aida, Otawara (JP); Yasuaki Kawasaki, Otawara (JP); Hiroshi Onihashi, Nasushiobara (JP); Katsuhisa Homma, Kuki (JP)

(73) Assignees: Kabushiki Kaisha Toshiba, Tokyo (JP); Toshiba Electron Tubes & Devices Co., Ltd., Tokyo (JP)

( * ) Notice: Subject to any disclaimer, the term of this patent is extended or adjusted under 35 U.S.C. 154(b) by 0 days.

(21) Appl. No.: 11/594,799

(22) Filed: Nov. 9, 2006

(65) Prior Publication Data

US 2007/0051895 A1 Mar. 8, 2007

Related U.S. Application Data

(63) Continuation of application No. PCT/JP2005/008712, filed on May 12, 2005.

(30) Foreign Application Priority Data

May 12, 2004 (JP) ............................. 2004-142800

(51) Int. Cl.
*G01T 1/24* (2006.01)
(52) U.S. Cl. ................................. 250/370.09
(58) Field of Classification Search ........... 250/370.09, 250/370.01, 370.08, 370.11
See application file for complete search history.

(56) References Cited

U.S. PATENT DOCUMENTS

| | | | | |
|---|---|---|---|---|
| 4,554,150 A | * | 11/1985 | Whelan | 117/84 |
| 7,115,878 B2 | * | 10/2006 | Ikeda et al. | 250/370.09 |
| 7,126,128 B2 | * | 10/2006 | Ikeda et al. | 250/370.09 |
| 2004/0113087 A1 | * | 6/2004 | Ikeda et al. | 250/370.09 |
| 2005/0253077 A1 | * | 11/2005 | Ikeda et al. | 250/370.09 |

FOREIGN PATENT DOCUMENTS

| | | | |
|---|---|---|---|
| EP | 1429156 A1 | * | 6/2004 |
| JP | 06-342098 | | 12/1994 |
| JP | 2001-228297 | | 8/2001 |
| JP | 2002-026300 | | 1/2002 |
| JP | 2002-314131 | | 10/2002 |
| JP | 2003-050281 | | 2/2003 |
| JP | 2003-209238 | | 7/2003 |
| JP | 2004-006766 | | 1/2004 |

OTHER PUBLICATIONS

International Search Report for PCT/JP2005/008712 dated Aug. 30, 2005.

* cited by examiner

*Primary Examiner*—David Porta
*Assistant Examiner*—Mark R Gaworecki
(74) *Attorney, Agent, or Firm*—Pillsbury Winthrop Shaw Pittman, LLP

(57) ABSTRACT

A radiation detector comprises pixel electrodes which collect charges, a photoelectric converting layer which is provided on the pixel electrodes and which converts incident radiation into the charges, and which contains at least one or more kinds of heavy metal halide ($AB_n$: A=heavy metal, B=halogen, n=either one of 1, 2, and 3) and at least one or more kinds of halogen ($B_2$) respectively, and an electrode layer which is provided on the photoelectric converting layer opposite to the pixel electrodes.

2 Claims, 12 Drawing Sheets

| Measurment document No. | Photoconductive material | Film thickness [μm] | Detected peak in XRD | Approximate composition ratio in EDX B/[nA] | Bias electric field [V/μm] |
|---|---|---|---|---|---|
| 1 | PbI2 | 100 | PbI2, Unknown peak | 1 | 0.6 |
| 2 | PbI2 | 100 | PbI2, I2 Unknown peak | 1.2 | 0.6 |
| 3 | PbI2 | 100 | PbI2, I2 Unknown peak | 1.1 | 0.6 |
| 4 | PbI2 | 100 | PbI2, I2 Unknown peak | 1 | 0.6 |
| 5 | PbI2 | 100 | PbI2, I2 Unknown peak | 0.9 | 0.6 |
| 6 | PbI2 | 100 | PbI2, I2 Unknown peak | 0.8 | 0.6 |
| 7 | HgI2 | 100 | HgI2, Unknown peak | 1 | 0.6 |
| 8 | HgI2 | 100 | HgI2, I2 Unknown peak | 1.2 | 0.6 |
| 9 | HgI2 | 100 | HgI2, I2 Unknown peak | 1.1 | 0.6 |
| 10 | HgI2 | 100 | HgI2, I2 Unknown peak | 1 | 0.6 |
| 11 | HgI2 | 100 | HgI2, I2 Unknown peak | 0.9 | 0.6 |
| 12 | HgI2 | 100 | HgI2, I2 Unknown peak | 0.8 | 0.6 |
| 13 | InI | 100 | InI, Unknown peak | 1 | 0.6 |
| 14 | InI | 100 | InI, I2 Unknown peak | 1.2 | 0.6 |
| 15 | InI | 100 | InI, I2 Unknown peak | 1.1 | 0.6 |
| 16 | InI | 100 | InI, I2 Unknown peak | 1 | 0.6 |
| 17 | InI | 100 | InI, I2 Unknown peak | 0.9 | 0.6 |
| 18 | InI | 100 | InI, I2 Unknown peak | 0.8 | 0.6 |
| 19 | BiI3 | 100 | BiI3, Unknown peak | 1 | 0.6 |
| 20 | BiI4 | 100 | BiI3, I2 Unknown peak | 1.2 | 0.6 |

FIG. 6A (Continued)

| Measurment document No. | Photoconductive material | Film thickness [μm] | Detected peak in XRD | Approximate composition ratio in EDX B/[nA] | Bias electric field [V/μm] |
|---|---|---|---|---|---|
| 21 | BiI5 | 100 | BiI3, I2 Unknown peak | 1.1 | 0.6 |
| 22 | BiI6 | 100 | BiI3, I2 Unknown peak | 1 | 0.6 |
| 23 | BiI6 | 100 | BiI3, I2 Unknown peak | 0.9 | 0.6 |
| 24 | BiI7 | 100 | BiI3, I2 Unknown peak | 0.8 | 0.6 |
| 25 | TlI | 100 | TlI, Unknown peak | 1 | 0.6 |
| 26 | TlI | 100 | TlI, I2 Unknown peak | 1.2 | 0.6 |
| 27 | TlI | 100 | TlI, I2 Unknown peak | 1.1 | 0.6 |
| 28 | TlI | 100 | TlI, I2 Unknown peak | 1 | 0.6 |
| 29 | TlI | 100 | TlI, I2 Unknown peak | 0.9 | 0.6 |
| 30 | TlI | 100 | TlI, I2 Unknown peak | 0.8 | 0.6 |
| 31 | TlBr | 100 | TlBr, Unknown peak | 1 | 0.6 |
| 32 | TlBr | 100 | TlBr, I2 Unknown peak | 1.2 | 0.6 |
| 33 | TlBr | 100 | TlBr, I2 Unknown peak | 1.1 | 0.6 |
| 34 | TlBr | 100 | TlBr, I2 Unknown peak | 1 | 0.6 |
| 35 | TlBr | 100 | TlBr, I2 Unknown peak | 0.9 | 0.6 |
| 36 | TlBr | 100 | TlBr, I2 Unknown peak | 0.8 | 0.6 |

FIG. 6B (Continued)

| Measurment document No. | Dark current (approximate number) [pA/cm²] | | | Pulse sensitivity [pC/cm²] [nC/kg] | | | 33msec after afterimage [%] |
|---|---|---|---|---|---|---|---|
| | Before X-ray irradiation | After X-ray irradiation | Change rate | Before X-ray irradiation | After X-ray irradiation | Change rate | |
| 1 | 680 | 3200 | 4.7 | 20 | 9 | 0.5 | 13 |
| 2 | 340 | 580 | 1.6 | 10 | 10 | 1 | 16 |
| 3 | 476 | 890 | 1.9 | 18 | 16 | 0.9 | 3 |
| 4 | 612 | 1230 | 2 | 22 | 18 | 0.8 | 4 |
| 5 | 1020 | 2570 | 2.5 | 26 | 19 | 0.7 | 7 |
| 6 | 2720 | 6500 | 2.4 | 28 | 18 | 0.6 | 9 |
| 7 | 550 | 2930 | 5.3 | 25 | 13 | 0.5 | 10 |
| 8 | 275 | 430 | 1.6 | 12.5 | 11 | 0.9 | 13 |
| 9 | 385 | 780 | 2 | 22.5 | 21 | 0.9 | 2 |
| 10 | 495 | 950 | 1.9 | 27.5 | 23 | 0.8 | 3 |
| 11 | 825 | 1920 | 2.3 | 32.5 | 25 | 0.8 | 5 |
| 12 | 2200 | 4930 | 2.2 | 35 | 23 | 0.7 | 7 |
| 13 | 1270 | 6430 | 5.1 | 12 | 5 | 0.4 | 20 |
| 14 | 635 | 1130 | 1.8 | 6 | 7 | 1.1 | 25 |
| 15 | 889 | 1690 | 1.9 | 10.8 | 9 | 0.8 | 4 |
| 16 | 1143 | 2450 | 2.1 | 13.2 | 12 | 0.9 | 7 |
| 17 | 1905 | 4120 | 2.2 | 15.6 | 11 | 0.7 | 10 |
| 18 | 5080 | 12900 | 2.5 | 16.8 | 13 | 0.8 | 13 |
| 19 | 830 | 4180 | 5 | 17 | 10 | 0.6 | 16 |
| 20 | 415 | 735 | 1.8 | 8.5 | 7 | 0.8 | 20 |

FIG. 6C (Continued)

| Measurment document No. | Dark current (approximate number) [pA/cm²] | | | Pulse sensitivity [pC/cm²] [nC/kg] | | | 33msec after afterimage [%] |
|---|---|---|---|---|---|---|---|
| | Before X-ray irradiation | After X-ray irradiation | Change rate | Before X-ray irradiation | After X-ray irradiation | Change rate | |
| 21 | 581 | 1320 | 2.3 | 15.3 | 14 | 0.9 | 3 |
| 22 | 747 | 1630 | 2.2 | 18.7 | 16 | 0.9 | 5 |
| 23 | 1245 | 2580 | 2.1 | 22.1 | 18 | 0.8 | 8 |
| 24 | 3320 | 9670 | 2.9 | 23.8 | 16 | 0.7 | 11 |
| 25 | 92 | 430 | 4.7 | 16 | 7 | 0.4 | 15 |
| 26 | 46 | 82 | 1.8 | 8 | 8 | 1 | 19 |
| 27 | 64.4 | 105 | 1.6 | 14.4 | 12 | 0.8 | 3 |
| 28 | 82.8 | 176 | 2.1 | 17.6 | 14 | 0.8 | 5 |
| 29 | 138 | 329 | 2.4 | 20.8 | 16 | 0.8 | 8 |
| 30 | 368 | 960 | 2.6 | 22.4 | 15 | 0.7 | 10 |
| 31 | 660 | 3590 | 5.4 | 7 | 4 | 0.6 | 25 |
| 32 | 330 | 580 | 1.8 | 3.5 | 4 | 1.1 | 31 |
| 33 | 462 | 820 | 1.8 | 6.3 | 6 | 0.9 | 5 |
| 34 | 594 | 1270 | 2.1 | 7.7 | 7 | 0.9 | 8 |
| 35 | 990 | 2350 | 2.4 | 9.1 | 8 | 0.9 | 13 |
| 36 | 2640 | 7320 | 2.8 | 9.8 | 8 | 0.8 | 17 |

F I G. 6D

Measurement: 10.0/100.0/0.02/0.6 (sec) Cu, I(max)=10864, 02/12/03 15:11
Peak: 19-pts/palobolic filter, threshold value= 2.1, cut off 0.1%, BG= 3/1.0, peaktop=peaktop
Memorandum: Intensity= Counts, 2θ(o)=0.0(deg), Wavelength for d-value calculation= 1.54056Å (Cu/Kα1)

| # | 2θ | d(Å) | Intensity | I% | Phase name | d(Å) | I% | h | k | l | 2θ | Δ2θ |
|---|---|---|---|---|---|---|---|---|---|---|---|---|
| 1 | 12.602 | 7.0183 | 10845 | 100.0 | PbI2-Lead Iodide | 6.9800 | 25.0 | 0 | 0 | 1 | 12.672 | 0.069 |
| 2 | 22.422 | 3.9619 | 28 | 0.3 | PbI2-Lead Iodide | 3.9450 | 6.0 | 1 | 0 | 0 | 22.519 | 0.097 |
| 3 | 25.440 | 3.4983 | 544 | 5.0 | PbI2-Lead Iodide | 3.4890 | 4.0 | 0 | 0 | 2 | 25.509 | 0.069 |
| 4 | 25.859 | 3.4426 | 941 | 8.7 | PbI2-Lead Iodide | 3.4350 | 100.0 | 1 | 0 | 1 | 25.917 | 0.058 |
| 5 | 34.202 | 2.6195 | 1534 | 14.1 | PbI2-Lead Iodide | 2.6140 | 55.0 | 1 | 0 | 2 | 34.276 | 0.074 |
| 6 | 38.619 | 2.3295 | 3095 | 28.5 | PbI2-Lead Iodide | 2.3270 | 6.0 | 1 | 1 | 0 | 38.661 | 0.042 |
| 7 | 39.462 | 2.2816 | 146 | 1.3 | PbI2-Lead Iodide | 2.2780 | 45.0 | 0 | 0 | 3 | 39.527 | 0.065 |
| 8 | 41.757 | 2.1614 | 37 | 0.3 | PbI2-Lead Iodide | 2.1661 | 14.0 | 1 | 1 | 1 | 41.661 | -0.096 |
| 9 | 45.159 | 2.0061 | 892 | 8.2 | PbI2-Lead Iodide | 2.0052 | 16.0 | 1 | 0 | 3 | 45.181 | 0.022 |
| 10 | 47.860 | 1.8990 | 67 | 0.6 | PbI2-Lead Iodide | 1.8997 | 18.0 | 2 | 0 | 1 | 47.842 | -0.018 |
| 11 | 52.323 | 1.7471 | 2106 | 19.4 | PbI2-Lead Iodide | 1.7449 | 6.0 | 0 | 0 | 4 | 52.392 | 0.070 |
| 12 | 53.259 | 1.7185 | 111 | 1.0 | PbI2-Lead Iodide | 1.7172 | 14.0 | 2 | 0 | 2 | 53.304 | 0.045 |
| 13 | 56.401 | 1.6300 | 181 | 1.7 | PbI2-Lead Iodide | 1.6276 | 8.0 | 1 | 1 | 3 | 56.492 | 0.092 |
| 14 | 57.681 | 1.5969 | 166 | 1.5 | PbI2-Lead Iodide | 1.5951 | 2.0 | 1 | 0 | 4 | 57.750 | 0.070 |
| 15 | 61.558 | 1.5053 | 68 | 0.6 | PbI2-Lead Iodide | 1.5043 | 4.0 | 2 | 1 | 0 | 61.601 | 0.043 |
| 16 | 63.642 | 1.4609 | 56 | 0.5 | PbI2-Lead Iodide | 1.4582 | 12.0 | 2 | 1 | 1 | 63.773 | 0.132 |
| 17 | 67.481 | 1.3868 | 290 | 2.7 | PbI2-Lead Iodide | 1.3852 | 8.0 | 1 | 1 | 4 | 67.570 | 0.089 |
| 18 | 68.382 | 1.3707 | 40 | 0.4 | PbI2-Lead Iodide | 1.3712 | 10.0 | 2 | 1 | 2 | 68.355 | -0.028 |
| 19 | 71.639 | 1.3162 | 541 | 5.0 | PbI2-Lead Iodide | 1.3158 | 8.0 | 0 | 0 | 5 | 71.664 | 0.024 |
| 20 | 85.136 | 1.1387 | 63 | 0.6 | PbI2-Lead Iodide | 1.1394 | 4.0 | 2 | 0 | 5 | 85.070 | -0.066 |
| 21 | 87.281 | 1.1161 | 242 | 2.2 | PbI2-Lead Iodide | 1.1159 | 2.0 | 1 | 0 | 6 | 87.304 | 0.023 |
| 22 | 98.216 | 1.0190 | 44 | 0.4 | PbI2-Lead Iodide | 1.0190 | 4.0 | 2 | 1 | 5 | 98.211 | -0.005 |

FIG. 7

Measurement: 10.0/100.0/0.02/0.6 (sec) Cu, I(max)=3153, 02/12/03 16:51
Peak: 15-pts/palobolic filter, threshold value= 2.0, cut off 0.1%, BG= 3/1.0, peaktop=peaktop
Memorandum: Intensity= Counts, 2θ(o)= 0.0 (deg), Wavelength for d-value calculation= 1.54056Å (Cu/Kα1)

| # | 2θ | d(Å) | Intensity | I% | Phase name | d(Å) | I% | h | k | l | 2θ | Δ2θ |
|---|---|---|---|---|---|---|---|---|---|---|---|---|
| 1 | 12.683 | 6.9735 | 3132 | 100.0 | PbI2-Lead Iodide | 6.9800 | 25.0 | 0 | 0 | 1 | 12.672 | -0.012 |
| 2 | 24.076 | 3.6934 | 67 | 2.1 | I2-Iodine | 3.7070 | 57.0 | 1 | 1 | 1 | 23.986 | -0.090 |
| 3 | 25.483 | 3.4926 | 207 | 6.6 | PbI2-Lead Iodide | 3.4890 | 4.0 | 0 | 0 | 2 | 25.509 | 0.026 |
| 4 | 25.926 | 3.4338 | 119 | 3.8 | PbI2-Lead Iodide | 3.4350 | 100.0 | 1 | 0 | 1 | 25.917 | -0.009 |
| 5 | 27.043 | 3.2945 | 152 | 4.9 | | | | | | | | |
| 6 | 28.120 | 3.1706 | 450 | 14.4 | | | | | | | | |
| 7 | 28.317 | 3.1491 | 326 | 10.4 | | | | | | | | |
| 8 | 29.639 | 3.0115 | 198 | 6.3 | | | | | | | | |
| 9 | 30.315 | 2.9459 | 144 | 4.6 | | | | | | | | |
| 10 | 30.614 | 2.9178 | 70 | 2.2 | I2-Iodine | 2.9220 | 1.0 | 2 | 2 | 0 | 30.569 | -0.045 |
| 11 | 34.264 | 2.6149 | 40 | 1.3 | PbI2-Lead Iodide | 2.6140 | 55.0 | 1 | 0 | 2 | 34.276 | 0.012 |
| 12 | 37.597 | 2.3904 | 85 | 2.7 | I2-Iodine | 2.3950 | 2.0 | 0 | 0 | 2 | 37.522 | -0.075 |
| 13 | 38.642 | 2.3281 | 1277 | 40.8 | I2-Iodine | 2.3280 | 16.0 | 0 | 1 | 2 | 38.644 | 0.002 |
| 14 | 39.505 | 2.2792 | 731 | 23.3 | PbI2-Lead Iodide | 2.2780 | 45.0 | 1 | 1 | 0 | 39.527 | 0.022 |
| 15 | 41.287 | 2.1848 | 58 | 1.9 | | | | | | | | |
| 16 | 41.559 | 2.1712 | 137 | 4.4 | PbI2-Lead Iodide | 2.1661 | 14.0 | 1 | 1 | 1 | 41.661 | 0.103 |
| 17 | 45.168 | 2.0057 | 34 | 1.1 | PbI2-Lead Iodide | 2.0052 | 16.0 | 1 | 0 | 3 | 45.181 | 0.013 |
| 18 | 45.967 | 1.9727 | 19 | 0.6 | I2-Iodine | 1.9785 | 22.0 | 3 | 2 | 1 | 45.825 | -0.142 |
| 19 | 47.581 | 1.9195 | 80 | 2.6 | | | | | | | | |
| 20 | 47.867 | 1.8988 | 14 | 0.4 | PbI2-Lead Iodide | 1.8997 | 18.0 | 2 | 0 | 1 | 47.842 | -0.025 |

FIG. 9A (Continued)

| Measurement: 10.0/100.0/0.02/0.6 (sec) Cu, I(max)=3153, 02/12/03 16:51 |||||||||||
| Peak: 15-pts/palobolic filter, threshold value= 2.1, cut off 0.1%, BG= 3/1.0, peaktop=peaktop |||||||||||
| Memorandum: Intensity= Counts, 2θ(o)=0.0 (deg), Wavelength for d-value calculation= 1.54056 Å (Cu/Kα1) |||||||||||
| # | 2θ | d(Å) | Intensity | % | Phase name | d(Å) | % | h | k | l | 2θ | Δ2θ |
|---|---|---|---|---|---|---|---|---|---|---|---|---|
| 21 | 52.206 | 1.8156 | 32 | 1.0 | I2- Iodine | 1.8170 | 7.0 | 4 | 0 | 0 | 50.166 | -0.040 |
| 22 | 52.344 | 1.7464 | 791 | 25.3 | PbI2-Lead Iodide | 1.7449 | 6.0 | 0 | 0 | 4 | 52.392 | 0.049 |
| 23 | 53.307 | 1.7171 | 23 | 0.7 | PbI2-Lead Iodide | 1.7172 | 14.0 | 2 | 0 | 2 | 53.304 | -0.003 |
| 24 | 56.460 | 1.6285 | 813 | 26.0 | PbI2-Lead Iodide | 1.6276 | 8.0 | 1 | 1 | 3 | 56.492 | 0.032 |
| 25 | 59.902 | 1.5429 | 249 | 8.0 | I2- Iodine | 1.5407 | 8.0 | 1 | 1 | 3 | 59.994 | 0.092 |
| 26 | 62.618 | 1.4823 | 53 | 1.7 | I2- Iodine | 1.4865 | 1.0 | 1 | 2 | 3 | 62.421 | -0.197 |
| 27 | 62.866 | 1.4771 | 82 | 2.6 | | | | | | | | |
| 28 | 63.199 | 1.4701 | 43 | 1.4 | | | | | | | | |
| 29 | 63.779 | 1.4581 | 60 | 1.9 | PbI2-Lead Iodide | 1.4582 | 12.0 | 2 | 1 | 1 | 63.773 | -0.006 |
| 30 | 64.271 | 1.4481 | 76 | 2.4 | I2- Iodine | 1.4477 | 1.0 | 4 | 0 | 2 | 64.291 | 0.020 |
| 31 | 65.061 | 1.4324 | 28 | 0.9 | I2- Iodine | 1.4323 | 6.0 | 4 | 1 | 2 | 65.067 | 0.006 |
| 32 | 66.376 | 1.4072 | 33 | 1.1 | I2- Iodine | 1.4086 | 3.0 | 1 | 3 | 3 | 66.301 | -0.075 |
| 33 | 67.518 | 1.3841 | 228 | 7.3 | PbI2-Lead Iodide | 1.3852 | 8.0 | 1 | 1 | 4 | 67.570 | 0.052 |
| 34 | 70.501 | 1.3346 | 18 | 0.6 | I2- Iodine | 1.3384 | 5.0 | 5 | 2 | 1 | 70.273 | -0.229 |
| 35 | 71.720 | 1.3149 | 92 | 2.9 | PbI2-Lead Iodide | 1.3158 | 8.0 | 1 | 0 | 5 | 71.664 | -0.056 |
| 36 | 74.228 | 1.2766 | 69 | 2.2 | I2- Iodine | 1.2801 | 1.0 | 5 | 3 | 1 | 73.988 | -0.240 |
| 37 | 75.655 | 1.2560 | 19 | 0.6 | I2- Iodine | 1.2556 | 4.0 | 2 | 1 | 3 | 75.682 | 0.028 |
| 38 | 84.537 | 1.1452 | 85 | 2.7 | PbI2-Lead Iodide | 1.1449 | 2.0 | 3 | 0 | 3 | 84.566 | 0.029 |
| 39 | 85.470 | 1.1245 | 42 | 1.3 | I2- Iodine | 1.1251 | 1.0 | 0 | 3 | 4 | 86.413 | -0.057 |

FIG. 9B

RADIATION DETECTOR

CROSS REFERENCE TO RELATED APPLICATIONS

This is a Continuation Application of PCT Application No. PCT/JP2005/008712, filed May 12, 2005, which was published under PCT Article 21(2) in Japanese.

This application is based upon and claims the benefit of priority from prior Japanese Patent Application No. 2004-142800, filed May 12, 2004, the entire contents of which are incorporated herein by reference.

BACKGROUND OF THE INVENTION

1. Field of the Invention

The present invention relates to a radiation detector provided with a photoelectric converting layer in which incident radiation is converted into charges.

2. Description of the Related Art

An active-matrix type plane detector largely attracts attention as an image detector for X-ray diagnosis of new generation. In the plane detector, an X-ray photographed image or a real time X-ray image is outputted as digital signals by detecting irradiated X-rays Moreover, the plane detector has an extremely great expectation even in terms of image quality performance and stability since it is a solid detector.

As a first usage of practical use, the plane detector has been developed for chest radiography or general radiography collecting a still image under a comparatively high dose, and commercialized in recent years. In the near future, commercialization is also expected for application in fields of circulatory organ and digestive organ where it is necessary to realize a real time moving image of not less than 30frames per second with higher performance and under through-view dose. For the usage of the moving image, improvement of S/N ratio and a real time processing technology or the like of minute signals become important development items.

Then, as for this kind of the plane detector, there are two kinds of methods of a direct method and an indirect method broadly classified. The direct method is a method in which photoconductive charges that are generated inside the body are directly converted into signal charges at the inner part of an X-ray photoconductor layer of an a-Se or the like by a high electric field, and these converted signal charges are accumulated in a capacitor for charge accumulation. Moreover, in the direct method, resolution characteristic which is nearly prescribed by a pixel pitch of the active matrix can be obtained, since the photoconductive charges generated by the incident X-ray are directly led to the capacitor for charge accumulation by the high electric field.

On the other hand, in the indirect method, after the incident X-ray is received by a scintillator layer and once it is converted into the visible light, the visible light is led to the capacitor for the charge accumulation by converting the light into the signal charges by an a-Si photodiode or a CCD. Moreover, in the indirect method, the resolution is deteriorated in accordance with optical diffusion and scattering until the visible light from the scintillator layer reaches the photodiode.

Further, as for the X-ray detector of the direct method, a TFT circuit board as a photoelectric converting part at which the capacitor for the accumulation, a thin film transistor (TFT), and a pixel electrode are respectively installed is provided at every pixel arranged on a substrate in a matrix shape. Then, for example, as shown in Japanese Patent Application Publication (KOKAI) No. 2003-209238(page 3-7, FIG. 2), a constitution in which X-ray photoconductive films are laminated on a flattening layer including the pixel electrode of the TFT circuit board as the photoconductive layer is known.

Namely, in this kind of the X-ray detector of the direct method, an "X-ray photoconductive material" is necessary in which the incident X-ray is directly converted into the charge signals. Then, these X-ray photoconductive materials are made as a kind of semiconductors. Further, as the main usage of an image detector which is an X-ray detector of the direct method, the size just sufficient to be able to cover a human body is necessary since there are many cases of using information from the X-rays made being permeated through the human body for medical use. For these reasons, the X-ray detector having about 40 cm length on one side is frequently used as an ordinarily used size.

At this time, if the X-ray detector of the direct method is attempted to be realized, the X-ray photoconductive films must be formed uniformly on the TFT circuit board having the size above 40 cm. Moreover, in order to fully detect the incident X-ray, the X-ray photoconductive films having the thickness of several hundreds μm are necessary even when using materials which are constituted of heavy metals and which have a large specific density. Namely, it is necessary to form a kind of semiconductor film having the size of even 40 cm of length on one side.

Further, as the X-ray detector of the direct method, amorphous selenium (a-Se) is used as the X-ray photoconductive material of the X-ray photoconductive film. However, when using the a-Se as the X-ray photoconductive material, a film-thickness of the X-ray photoconductive film of the a-Se is formed to be around 1 mm, and for example the a-Se is used as the X-ray photoconductive material by applying a strong bias electric field of around 10 V/μm to both ends of the X-ray photoconductive film in order to increase photoconductive charge forming rate per one piece of X-ray photon, in order to make the formed photoconductive charges reach the pixel electrode without being trapped of the formed photoconductive charges by a defect level in the film, and in order to suppress the bias electric field and the diffusion of the charges in the direction at right angles to the bias electric field.

Moreover, as the X-ray detector of other direct methods, a heavy metal compound such as lead iodide ($PbI_2$) and mercury iodide ($HgI_2$) is used as the X-ray photoconductive material. In this case, a heavy metal compound such as these lead iodide ($PbI_2$) and mercury iodide ($HgI_2$) is formed on the TFT circuit board in a film-like shape by vacuum vapor-deposition, or a solution is formed by mixing powders of these heavy metal compounds into a resin solution having charge transferability, and by drying the solution after the solution is coated on the TFT circuit board, the X-ray photoconductive film is made.

However, when using the a-Se as the X-ray photoconductive material as described above, there is a problem in stability since detection sensitivity for converting the X-rays by the a-Se into the charges is low, and a recrystallization temperature is low. Further, in the a-Se, the film thickness of around 1 mmt is necessary since X-ray absorption rate is low due to a small atomic number. Further, manufacturing cost becomes increasing since material efficiency is not so superior for forming the a-Se of the film thickness of around 1 mmt by a vapor-deposition method which is a fabricating method of the a-Se.

Moreover, in composite coating formation with a highly sensitive photoconductive material and an organic material binder, which is another fabricating method when using the a-Se as ray photoconductive material, it is not easy to fully obtain original characteristic of the highly sensitive photoconductive material since the a-Se is a composite with the organic material binder. Further, when the highly sensitive photoconductive material is formed by the vapor-deposition, this formation has problems that unnecessary fabricating cost is charged since the material efficiency is not so superior, and it is not easy to obtain the X-ray photoconductive film of which characteristic is superior.

BRIEF SUMMARY OF THE INVENTION

The present invention has been carried out by taking such points into consideration, and this object is to provide the radiation detector which can improve the detection sensitivity and the stability of the photoelectric converting layer.

According to an aspect of the present invention, there is provided a radiation detector comprising:

pixel electrodes which collect charges;

a photoelectric converting layer which is provided on the pixel electrodes and which converts incident radiation into the charges, and which contains at least one or more kinds of heavy metal halide ($AB_n$:A=heavy metal, B=halogen, n=either one of 1, 2, and 3) and at least one or more kinds of halogen ($B_2$) respectively; and an electrode layer which is provided on the photoelectric converting layer opposite to the pixel electrodes.

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 6A represents a drawing to show characteristics of a photoelectric converting layer of the radiation detector;

FIG. 6B represents a drawing succeeding to FIG. 6A to show characteristics of a photoelectric converting layer of the radiation detector;

FIG. 6C represents a drawing succeeding to FIG. 6B to show characteristics of a photoelectric converting layer of the radiation detector;

FIG. 6D represents a drawing succeeding to FIG. 6C to show characteristics of a photoelectric converting layer of the radiation detector;

FIG. 7 represents a drawing to show peaks of intensity of respective measurement documents of the photoelectric converting layers of the radiation detector;

FIG. 9A represents a drawing to show peaks of intensity of respective measurement documents of the photoelectric converting layer of the radiation detector;

FIG. 9B represents a drawing succeeding to FIG. 9A to show peaks of intensity of respective measurement documents of the photoelectric converting layer of the radiation detector.

DETAILED DESCRIPTION OF THE INVENTION

The constitution of one embodiment for carrying out the preferred embodiment of a radiation detector of the present invention is explained with reference to drawings of FIG. 1 to FIG. 5 as follows.

Figure 3:
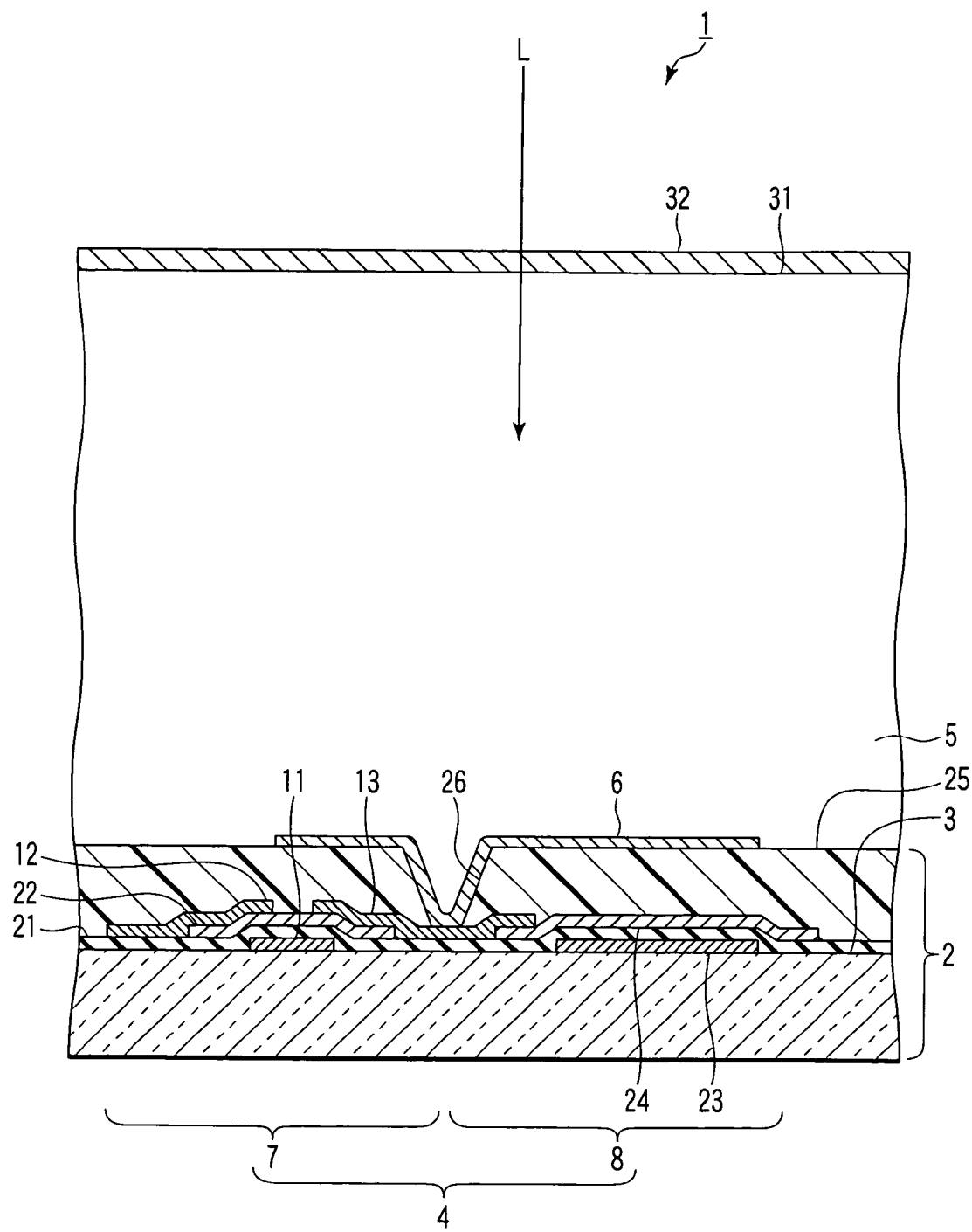
FIG. 3 represents an exemplary cross-sectional view to show the radiation detector.
Figure 4:
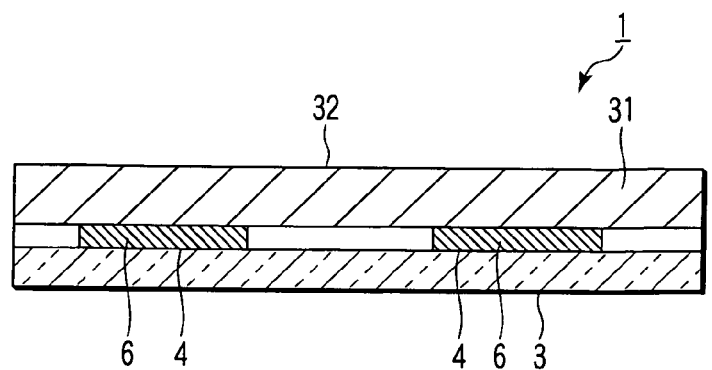
FIG. 4 represents an exemplary constitutional drawing to show the radiation detector.
Figure 5:
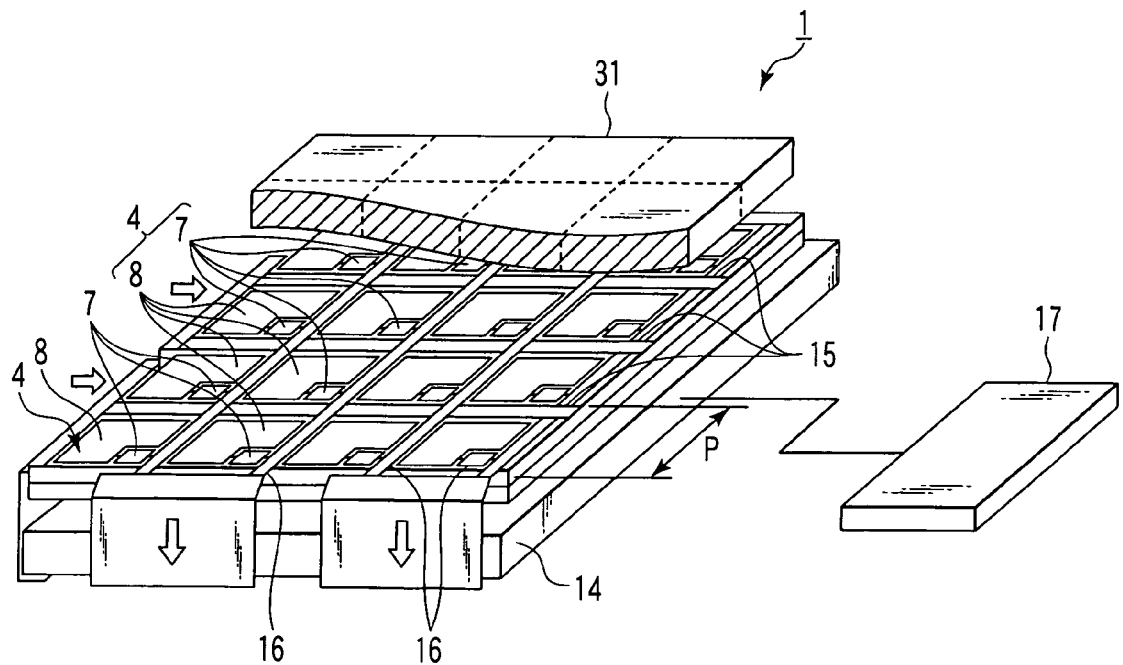
FIG. 5 represents an exemplary top plan view to show the radiation detector.
Figure 8:
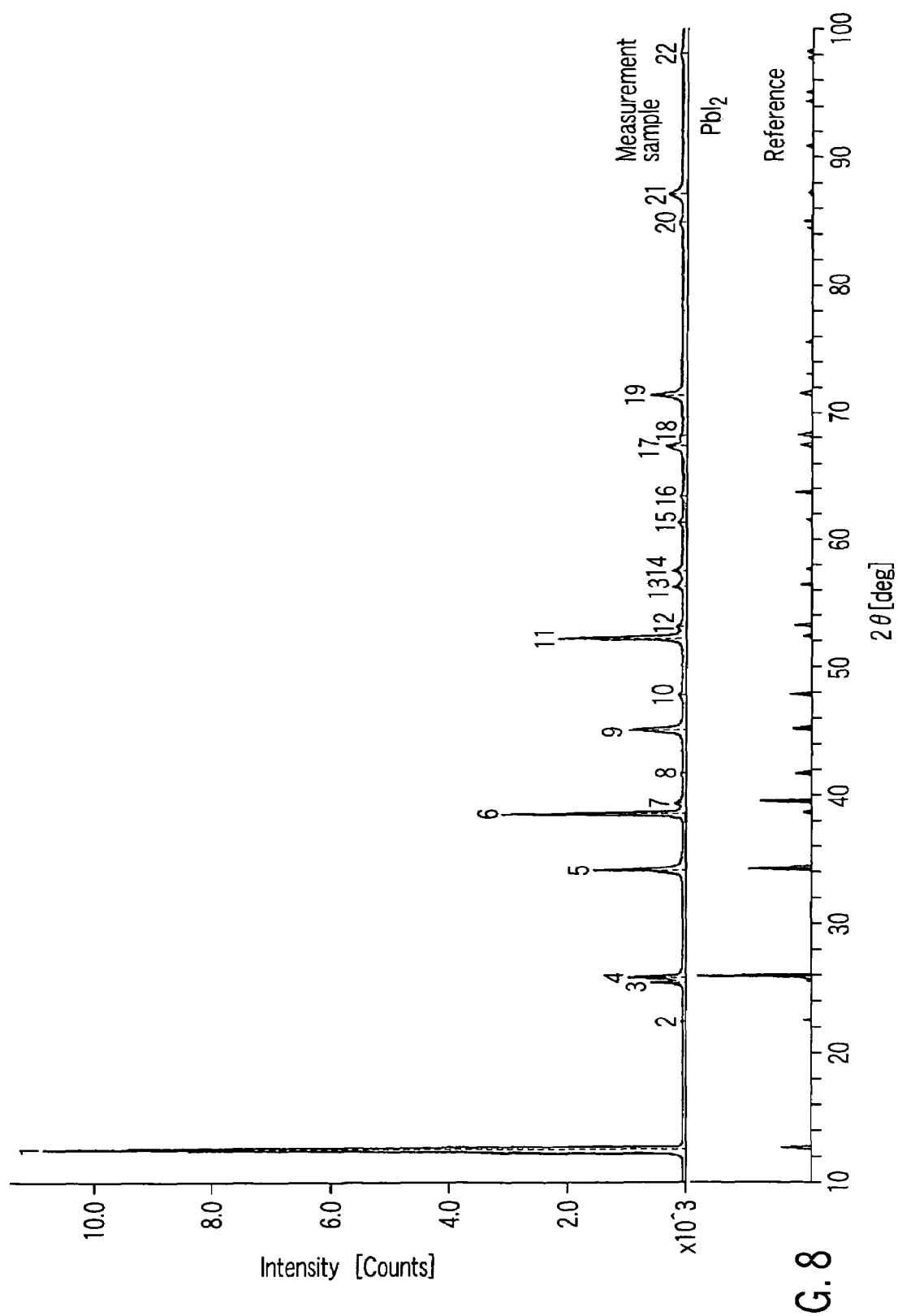
FIG. 8 represents a graph to show peaks of intensity of respective measurement document of the photoelectric converting layer of the radiation detector.
Figure 10:
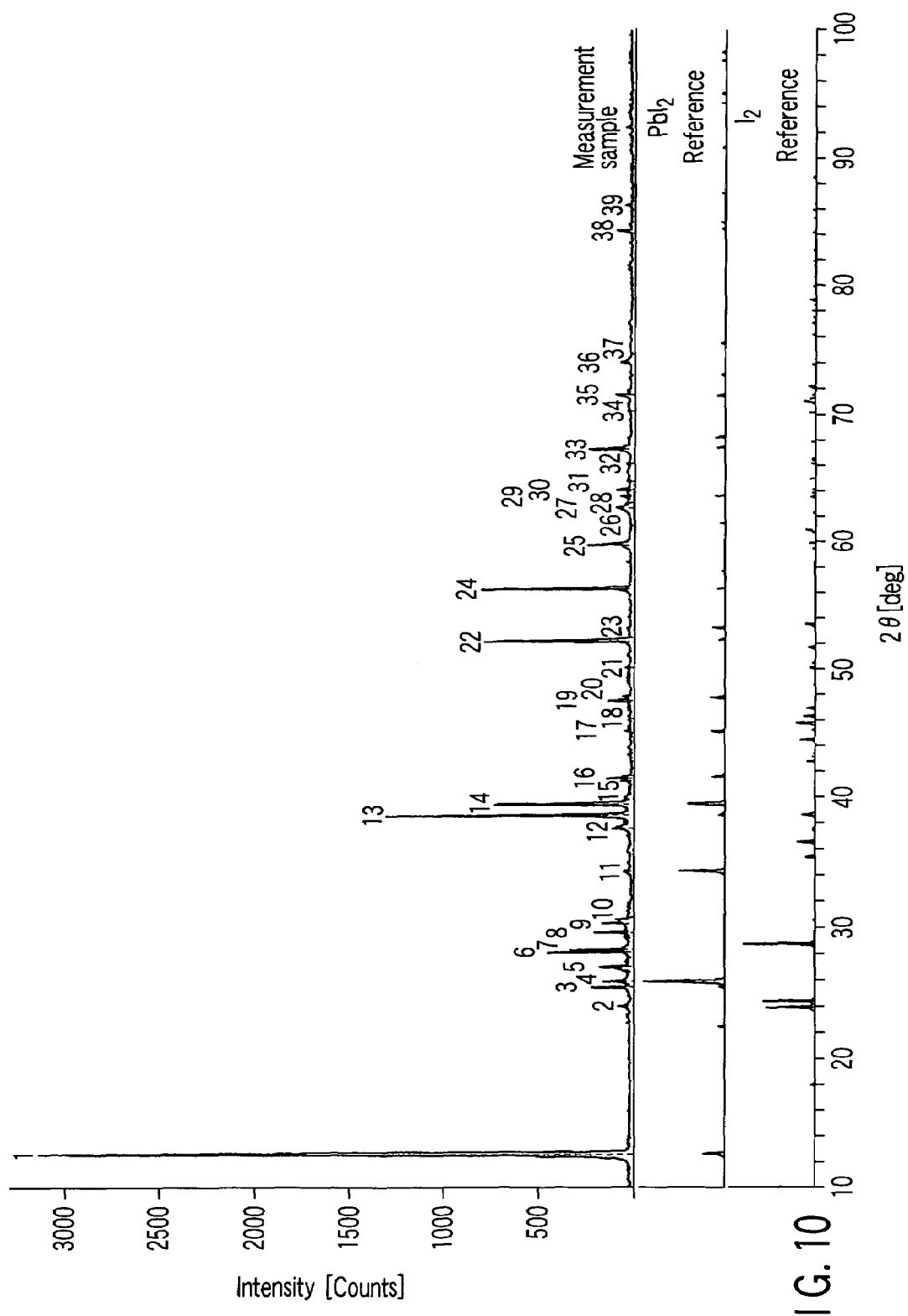
FIG. 10 represents a graph to show peaks of intensity of respective measurement document of the photoelectric converting layer of the radiation detector.

In FIG. 3 to FIG. 5, the X-ray detector 1 of the direct method is an X-ray plane sensor of straight line conversion type as an X-ray planar detector detecting an image of X-ray which is a radiation. The X-ray detector 1 is a detector for the X-ray, and a halogen compound of especially high sensitivity is used for X-ray light electroconductive material. Moreover, the X-ray detector 1 is provided with a photoelectric converting substrate 2 as a TFT circuit board as shown in FIG. 3 and FIG. 4. The photoelectric converting substrate 2 is an active matrix photoelectric converting substrate as a TFT circuit board.

Then, the photoelectric converting substrate 2 has a glass substrate 3 which is an insulating substrate such as glass having translucency. On a surface which is one main surface of the glass substrate 3, a plurality of nearly rectangular photoelectric converting part 4 which functions as a photosensor are arranged in matrix. Then, on the surface of the glass substrate 3, a plurality of pixels 5 of respectively the same structure are installed by the respective photoelectric converting parts 4. These respective pixels 5 are thin film element pixels arranged and formed two-dimensionally at a respectively prescribed pitch P in the row direction which is the lateral direction in FIG. 5 and in the column direction which is the longitudinal direction in FIG. 5.

Then, at these respective pixels 5, pixel electrodes 6 of nearly L-shaped flat plates as current collecting electrodes to collect electric signals and signal charges are provided at these respective pixels 5. These respective pixel electrodes 6 are provided respectively at a pixel unit, namely at the center part of the respective pixels 5 on the surface of the glass substrate 3. Here, these pixel electrodes 6 are film-formed for example by an Indium-Tin Oxide(ITO) transparent conducive film or an aluminum (Al) thin film by a sputtering method and an electron beam (EB) vapor-deposition method or the like. Further, after film-forming the ITO film or the aluminum film which become these pixel electrodes 6, these pixel electrodes 6 are separated and constituted at every pixel unit by a Photoelectrophoretic imaging (PEP) process including an etching process.

Further, thin film transistors (TFT) 7 as switching element parts constituting switching parts are electrically connected to these respective pixel electrodes 6. As for these respective thin film transistors 7, at least one portion is constituted of amorphous silicon (a-Si) as an amorphous semiconductor which is a semiconductor material having a crystallinity. Further, these respective transistors 7 store and release the charges based on a potential difference detected at the pixel electrodes 6. Moreover, these respective thin film transistors 7 are respectively provided at the respective pixels 5.

Moreover, at these respective pixels 5, accumulating capacitors 8 on a rectangular flat plate are provided which are accumulating elements as a charge accumulating capacity part to accumulate the signal charges detected at the pixel electrodes 6. These accumulating capacitors 8 are oppositely arranged under the pixel electrodes 6. Here, the thin film transistors 7 have a gate electrode 11, a source electrode 12, and a drain electrode 13, respectively. The drain electrode 13 is electrically connected to the pixel electrodes 6 and the accumulating capacitors 8, respectively.

Further, on one side edge along the row direction on the surface of the glass substrate 3, a high-speed signal processing part 14 which is a control circuit as a driver circuit of a slender elongated rectangular flat plate state to control an operation state of the respective thin film transistors 7, for example ON and OFF of the respective thin film transistors 7 is mounted. The high speed processing part 14 is a line driver as a signal processing circuit to control reading out of the signal and to treat the read-out signal. Then, the high-speed signal processing part 14 has the longitudinal direction along the column direction on the surface of the glass substrate 3, and is arranged in a folding-back state to the rear surface side of the glass substrate 3. Namely, the high-speed signal processing part 14 is mounted oppositely to the rear surface side of the glass substrate 3.

Then, one end of each control line 15 is electrically connected to the high-speed processing part 14. These respective control lines 15 are wired along the row direction of the glass substrate 3 and arranged between the respective pixels 5 on the glass substrate 3. Further, these respective control lines 15 are electrically connected to the gate electrodes 11 of the thin film transistors 7 constituting the respective pixels 5 of the same row respectively.

Moreover, on the surface of the glass substrate 3, a plurality of data lines 16 along the column direction of the glass substrate 3 are wired. These respective data lines 16 are arranged between the respective pixels 5 on the glass substrate 3. Then, these respective data lines 16 are electrically connected to the respective source electrodes 12 of the thin film transistors 7 constituting the pixels 5 of the same column. Namely, these respective data lines 16 makes image data signals received from the thin film transistors 7 constituting the pixels of the same column.

Then, one end of each data line 16 is electrically connected to the high-speed signal processing part 14. Further, a digital image transmission part 17 is electrically connected to the high-speed signal processing part 14. The digital image transmission part 17 is mounted in a state of being led outside the photoelectric converting substrate.

On the other hand, as shown in FIG. 3, the thin film transistor 7 and the accumulating capacitor 8 are formed at each pixel 5 on the surface of the glass substrate 3. Here, each of the thin film transistor 7 is provided with the gate electrodes 11 of an island state formed on the glass substrate 3. Then, an insulating film 21 is laminated and formed on the glass substrate 3 including the gate electrodes 11. This insulating film 21 covers the respective gate electrodes 11.

Moreover, a plurality of semi-insulating films 22 of island state are laminated and formed on this insulating film 21. The semi-insulating films 22 are arranged opposite to the respective gate electrodes 11, and cover these respective gate electrodes 11. Namely, each semi-insulating film 22 is provided on the gate electrode 11 via the insulating film 21. Further, on the insulating film 21 including the semi-insulating films 22, the source electrodes 12 and the drain electrodes 13 are formed respectively. In each thin film transistor, the source electrode 12 and drain electrode 13 are mutually insulated and not electrically connected. Moreover, the source electrode 12 and drain electrode 13 are provided at both sides on the gate electrode 11, and the respective one end parts of these source electrode 12 and drain electrode 13 are laminated on the semi-insulating films 22.

Then, as shown in FIG. 5, the gate electrode 11 of each thin film transistor 7 is electrically connected to the common control line 15 together with the gate electrodes 11 of the other thin film transistors 7 positioned in the same row. Further, the source electrode 12 of each thin film transistor 7 is electrically connected to the common data line 16 together with the source electrodes 12 of other thin film transistors 7 positioned in the same column.

On the other hand, each accumulating capacitors 8 is provided with the lower part electrode 23 of the island state formed on the glass substrate 3. The insulating film 21 is laminated and formed on the glass substrate 3 including the lower part electrodes 23. This insulating film 21 is extended from on the gate electrode 11 to on the lower part electrode 23 of each thin film transistor 7. Further, the upper part electrodes 24 of the island state are laminated and formed on the insulating film 21. Each upper part electrode 24 is arranged opposite to the lower part electrode 23, and covers the lower part electrode 23. Namely, each upper part electrodes 24 is installed on the lower part electrodes 23 via the insulating film 21. Then, each of the drain electrode 13 is laminated and formed on the insulating film 21 including the upper part electrode 24. As for the drain electrode 13, the other end part is laminated on the upper part electrode 24, and electrically connected to the upper part electrode 24.

Further, on the insulating film 21 including the semi-insulating film 22, the source electrode 12, and the drain electrode 13 of the respective thin film transistors 7 and including the upper part electrode 24 of the respective accumulating capacitors 8 respectively, a flattening layer 25 as the insulating layer is laminated and formed. The flattening layer 25 is constituted of a resin, and in one part of the flattening layer 25, a through hole 26 which is a contact hole as a communicating part communicated with the drain electrode 13 of the thin film transistor 7 is opened and formed. Then, the pixel electrodes 6 are laminated and formed on the flattening layer 25 including the through holes 26. Accordingly, each pixel electrode 6 is electrically connected to the drain electrode 13 of the thin film transistor 7 via the through hole 26. Moreover, the thin film transistor 7 is provided at the lower layer of the pixel electrode 6.

Further, on the flattening layer 25 including the pixel electrodes 6, a photoconductive layer 31 as a radiation photoelectric converting layer to change an incident X-ray L into charges is film-formed and laminated. The photoconductive layer 31 is an X-ray photoconductive film as an X-ray photoelectric converting film. Here, the pixel electrodes 6 are provided under the photoconductive layer 31 which is the side opposed to the X-ray L incident into the photoconductive layer 31 in a state of direct contact with this photoconductive layer 31. In other words, the pixel electrodes 6 are provided on the opposite side of the direction side where the X-ray L is incident against the photoconductive layer 31. Namely, the pixel electrodes 6 are provided at the lower face of the photoconductive layer 31 positioned on the opposite side to the side where the X-ray L is incident against the photoconductive layer 31.

Then, this photoconductive layer 31 has a film thickness of 0.3 mmt, and is constituted of an X-ray photoconductive material which is the photoconductive material to convert the incident X-ray L into the electric signal.

Here, the photoconductive layer 31 is one in which limitations are added regarding components, composition ratio, specified impurities, and effects of quantitative contents of these specified impurities, etc. of the X-ray photoconductive material constituting the photoconductive layer 31. Concretely, as the X-ray photoconductive material, at least one kind or more of heavy metal halide ($AB_n$: A=heavy metal, B=halogen, n=either one of 1, 2, and 3) and at least one kind or more of halogen ($B_2$) are contained, respectively.

Namely, the photoconductive layer 31 is composed of at least one kind or more of heavy metal halide ($AB_n$:n=1, 2, or 3) and at least one kind or more of halogen ($B_2$) as the X-ray photoconductive material. Concretely, in this X-ray photoconductive material, as the heavy metal halide, at least one kind or more of lead iodide ($PbI_2$), mercury iodide ($HgI_2$), indium iodide (InI), thallium iodide (TlI), and bismuth iodide ($BiI_2$) are contained. Moreover, in the X-ray photoconductive material, iodine (I) is contained as halogen.

Further, the photoconductive layer 31 contains at least one kind or more of heavy metal (A) as the X-ray photoconductive material. Namely, the photoconductive layer 31 contains, for example lead (Pb) element and iodine (I) element as the main components. At this time, in the photoconductive layer 31, besides the lead element, mercury (Hg) element or the like is configured to be used and contained. Further, in the photoconductive layer 31, besides the iodine element, other halogen element is configured to be used and contained also.

Further, the photoconductive layer 31 is constituted for the purpose that a molar composition ratio (B/(nA)) of halogen (B) and heavy metal (A) constituting the heavy metal halide in the photoconductive layer 31 become 0.9or more and 1.1or less. Further, the photoconductive layer 31 is constituted for the purpose that respective contents contained in the photoconductive layer 31 of elements belonging to neighboring periodic families to the heavy metal element and of elements neighboring to the elements belonging to the same periodic families in the neighboring periods before and after the heavy metal element in the periodic table become 10 wtppm or less as impurities.

Here, the photoconductive layer 31 is adhered and formed on the flattening layer 25 including the pixel electrodes 6 for example by a metal such as indium (In) and a conductive resin or the like. Moreover, the photoconductive layer 31 is configured to be adhered on the flattening layer 25 including the pixel electrodes 6 by thermal pressure bonding.

Further, on the photoconductive layer 31, a bias electrode layer 32 which is a thin film electrode as an electrode layer is laminated and formed. The bias electrode layer 32 is a bias electrode film laminated uniformly over the whole photoelectric converting parts 4. Moreover, the bias electrode layer 32 is provided on the photoconductive layer 31 opposite to the pixel electrodes 6. Then, as for the bias electrode layer 32, for example an ITO film or an aluminum film is film-formed by a sputtering method.

In other words, as for the bias electrode layer 32, for example an ITO transparent conductive film or an aluminum thin film is film-formed by the sputtering method or an electron beam vapor-deposition method or the like. Namely, this bias electrode layer 32 is integrally formed so that a bias electric field can be formed between each pixel electrode 6 by applying a common bias voltage to the pixel electrode 6 of each pixels 5.

Next, an action of the above described one embodiment is explained.

Firstly, the X-ray L is incident into the photoconductive layer 31, and the incident X-ray L by this photoconductive layer 31 is converted into signal charges which are electric signals. At this time, the signal charges are carried and moved to the pixel electrode 6 by the bias electric field formed between the bias electrode layer 32 and the pixel electrode 6, and accumulated in the accumulating capacitors 8 via the drain electrode 13 and the like from this pixel electrode 6.

On the other hand, reading-out of signal electric charges accumulated in the accumulating capacitor 8 is controlled by a high-speed signal processing part 14 sequentially, for example, by every row of the pixel unit 12 (in the lateral direction of FIG. 5).

At this time, an ON signal of, for example 10V is added to each of the gate electrodes 11 of the pixel unit positioned at a first row from the high-speed signal processing part 14 through a first data line 16, thereby each of the thin film transistors 7 of the pixel unit at the first row is made to have an ON state.

At this time, the signal charges accumulated in each of the accumulating capacitors 8 of the pixel unit of the first row are outputted as the electric signals from the drain electrode 13 to the source electrode 12. Then, the electric signals outputted to each source electrode 12 are amplified by the high-speed signal processing part 14.

Further, these amplified electric signals are added to a digital image transmission part, and after they are converted into series signals, they are converted into digital signals, and sent to a signal processing part of the next stage which is not illustrated.

Then, when reading-out of the electric charges of the accumulating capacitors 8 of the pixel unit positioned at the first row is finished, an OFF signal of, for example −5V is added to the gate electrodes 11 of the pixel unit of the first row from the high-speed signal processing part 14 through a first data line 16, thereby the respective thin film transistors 7 of the pixel unit of the first row is made to have an OFF state.

Afterwards, above mentioned actions are sequentially carried out to the pixel unit in the second row in the order. Then, the signal charges accumulated in the accumulating capacitors 8 of all the pixel unit are read out, converted into digital signals and are outputted in the order, thereby the electric signal corresponding to an X-ray image plane is outputted from the digital image transfer part 17.

As mentioned above, according to one embodiment, since halogen in addition to heavy metal halide is made to be contained in the photoconductive layer 31, variations of the dark-current characteristic, the sensitivity characteristic, and the afterimage characteristic of the photoconductive layer 31 by irradiation of X-ray L are suppressed, and a stable photoconductive layer is made. At this time, when a surplus halogen is contained in this photoconductive layer 31, it is considered that an effect is occurring that suppresses dissociation of halogen in the heavy metal halide crystal structure which is apt to occur during the irradiation of the X-ray L, and that suppresses generation of crystal defects accompanied with this dissociation of halogen.

Namely, it is considered that since the dissociation of halogen from the crystal structure of the photoconductive layer 31 yields the defect level in the photoconductive layer 31 that causes a deep trap of the electric charge influencing on the dark-current characteristic, sensitivity characteristic and afterimage characteristic, suppression of the occurrence of this defect is extremely effective for a stable action of the X-ray detector 1. However, if this surplus halogen exists in this photoconductive layer 31 too much, halogen is precipitated at grain boundary of this photoconductive layer 31, and the afterimage is lengthened since conductivity between the minute crystals of the photoconductive layer 31 is obstructed, the sensitivity characteristic of this photoconductive layer 31 as a whole is obstructed, and especially the afterimage characteristic is obstructed greatly.

From such reasons, it is desirable that the surplus halogen in the photoconductive layer 31 is within a proper range against the stoichiometry of the heavy metal halide. Concretely, as the total amount obtained by adding the heavy metal halide ($AB_n$) and halogen ($B_2$), namely as the ratio in the total between halogen element (B) and heavy metal element (A), roughly the range of around $B/(nA) \leq 1.1$ is desirable.

Further, the heavy metal element is further contained in the photoconductive layer 31 by making the heavy metal halide, halogen, and the heavy metal respectively contained in this photoconductive layer 31. For that reason, effective charge mobility of the photoconductive layer 31 increases, and the improvement in collection efficiency of X-ray photoconductive charges in the photoconductive layer 31 leads to the improvement in sensitivity. At this time, as for characteristic having a trade-off relationship with that when surplus heavy metal elements are increased in the photoconductive layer 31, dark-current is increased. Accordingly, it is desirable that surplus heavy metals are within a moderate range against the stoichiometry of the heavy metal halide. Namely, the heavy metal halide ($AB_n$), halogen ($B_2$) and heavy metal are summed up, and roughly the range of around $0.9 \leq B/(nA)$ is desirable as the ratio between the heavy metal element (A) and the halogen element (B).

Moreover, as for impurities contained in the photoconductive layer 31, it is undesirable that the element belonging to families neighboring to the heavy metal element constituting the heavy metal halide, and families neighboring to the periods before and after the heavy metal exist. This comes to compose donor level and acceptor level in the photoconductive layer by means that these impurities replace the heavy metal element of the heavy metal halide. Accordingly, this is because that the dark-current increases by lowering resistivity after the vacant level density of a conduction band and the valence electron density of a valence band are reduced, while there is a strong possibility of decreasing change of the film resistivity, namely sensitivity characteristic at the time of X-ray L irradiation.

Concretely, when lead iodide is used for the heavy metal halide, as a concrete example of the undesirable impurities, thallium of family 3B neighboring to lead (Pb) of family 4B, bismuth of family 5B, and indium which is of family 3B and antimony (Sb) or the like of family 5B before one period in the periodic table are corresponding. Accordingly, metal impurity elements are often contained at the ratio of dozens of ppm in raw materials of the heavy metal halide and the film-formed photoconductive layer 31 using the materials, but these undesirable impurity elements are necessary to be suppressed to at most 10 wtppm or less.

Namely, as a conventional photoconductive layer, a film in which amorphous selenium (a-Se) has been vapor-deposited into the photoconductive layer, a film on which a mixture has been coated after a binder such as epoxy compound is mixed into a highly sensitive photoconductive material such as heavy metal halide, and a film which has been formed by vapor-deposition of a highly sensitive photoconductive material single body or by single crystal growth or the like have been used. On the contrary, as one embodiment as described above, the detection sensitivity becomes larger than that of the photoconductive layer of an a-Se film by single-digit or more by making heavy metal halide, halogen and heavy metal respectively contained in the photoconductive layer 31. Further, the amount of X-ray absorption like the photoconductive layer of the a-Se film can be secured because of having film-thickness which is a half or less of the photoconductive layer of the a-Se film.

Accordingly, the detection sensitivity and photoconductive characteristics of a direct type X-ray detector 1 can be stabilized. Thus, since the X-ray detector 1 has the high sensitivity, the small dark-current, and excellent afterimage characteristic, and wherein changes in these characteristics especially by the irradiation of the X-ray L can be suppressed to be extremely small, this can be made to have excellent stability and reliability.

Moreover, explanation on the X-ray detector 1 for detecting the X-ray L has been made in the above-mentioned respective embodiments, but a radiation detector can be used by being made to correspond to the X-ray detector, for example even if the detector is the radiation detector for detecting various kinds of radiations besides the X-ray L for example such as γ-rays. Moreover, like an area sensor, etc., pixels 5 in which thin film transistors 7 and pixel electrodes 6 are formed on a glass substrate 3 of a photoelectric converting part 4 in a two-dimensionally matrix respectively along the longitudinal direction and the lateral direction, but the pixels 5 may be provided one-dimensionally on the glass substrate 3 of the photoelectric converting part 4 in the case of a line sensor or the like.

Moreover, even if the photoconductive layer 31 is converted to be a scintillator layer in which the incident X-ray L is converted into visible light, and the pixel electrode 6 is converted to be a photodiode into which the visible light converted by the scintillator layer is converted into signal charges, the same action effect as that of the X-ray detector 1 in the above-mentioned respective embodiments can be played. Further, this can be used as the X-ray detector 1 by being made to cope with the detector using the thin film transistor 7 constituted of an amorphous semiconductor, a crystalline semiconductor, and a polycrystalline semiconductor.

EXAMPLE

Next, one example of the present invention will be explained.

Firstly, as for the photoconductive layer 31 of a conventional heavy metal halide obtained by film-forming lead iodide ($PbI_2$) as raw materials on a flattening layer 25 including the pixel electrodes 6 by a general vacuum vapor-deposition method or the like, the halogen element having a high vapor pressure is apt to be rather short inevitably when the heavy metal and halogen are decomposed and vapor-deposited onto the photoelectric converting substrate 2. Especially, a tendency in which the halogen element runs short becomes stronger as a temperature of the photoelectric converting substrate 2 is risen in order to improve crystallinity in the film of the photoconductive layer 31.

Thus, in order to carry out trial manufacturing a characteristic-improved film containing halogen, or halogen and the heavy metal in the photoconductive layer 31, the photoconductive layer 31 which is vapor-deposition film has been formed by taking-in vapor-deposition atmosphere in iodine (I) vapor, and by appropriately changing temperature and vapor-deposition speed of respective photoelectric converting substrates 2. At this time, the film thickness of the photoconductive layer 31 has been united to around 100 μm. Then, by forming an ITO film on the photoconductive layer 31 by a sputtering method, and by making them as a bias electrode layer 32, the sensitivity and dark-current characteristics of the bias electrode layer 32 have been compared.

Moreover, as analysis of the photoconductive layer 31, a crystal structure constituting the photoconductive layer 31 has been analyzed by using an X-ray diffraction analyzer (XRD), and a composition ratio of main constituting elements has been analyzed by using an energy dispersion type X-ray micro-analyzer (EDX). At this time, materials, analyzed results, and characteristics (sensitivity, dark-current and afterimage) at 25° C. of respective photoconductive layers 31 are respectively shown in FIG. 6A to FIG. 10.

As a result, in the case lead iodide ($PbI_2$) is used as the X-ray photoconductive material in the photoconductive layer 31, and in the case not only lead iodide but also iodine (I) are detected in the photoconductive layer 31 from the results analyzed by the X-ray diffraction analyzer as shown in FIG. 6A to FIG. 6D, changes of the dark-current characteristic and the sensitivity characteristic before and after the irradiation of the X-ray L are suppressed smaller. At this time, irradiation conditions of this X-ray L are the results of irradiating the X-ray L for 10 seconds under conditions of 3 mR/frame, pulse width 16 msec, and 30 frames/sec, and measuring the sensitivity and dark-current characteristics after the irradiation of the X-ray L after one second from finishing of the irradiation.

Further, it is found that the afterimage characteristic by the X-ray detector 1 is also excellent. Namely, it is considered that excellence of the afterimage characteristic (afterimage is less) is connected to a merit having small dark-current change (increase) after the irradiation of the X-ray L. However, since adverse effect to the afterimage characteristic and the sensitivity characteristic are produced when surplus iodine contained in the photoconductive layer 31 is too much, as the composition ratio of I/Pb, the range up to 2.2, namely around I/(2Pb)≦1.1 is preferable. At this time, small characteristic change in the photoconductive layer 31 against the irradiation of the X-ray L is an extremely important characteristic for the stable operation of the X-ray detector 1.

Moreover, lead iodide and iodine are detected in the photoconductive layer 31 in the analysis by the X-ray diffraction analyzer, and as for a sample in which the composition ratio of I/Pb is 2 or less in the analysis by the energy dispersion type X-ray micro-analyzer, free lead is considered to be present in the photoconductive layers 31. At this time, the sensitivity characteristic of this photoconductive layer 31 is improved. However, even in this case, the dark-current comes to be extremely increased since surplus lead contained in this photoconductive layer 31 is too much. For that reason, as the composition ratio of iodine (I)/lead (Pb) in the photoconductive layer 31, the range up to 1.8, namely around 0.9≦I/(2Pb)≦1.1 is preferable.

Figure 1:
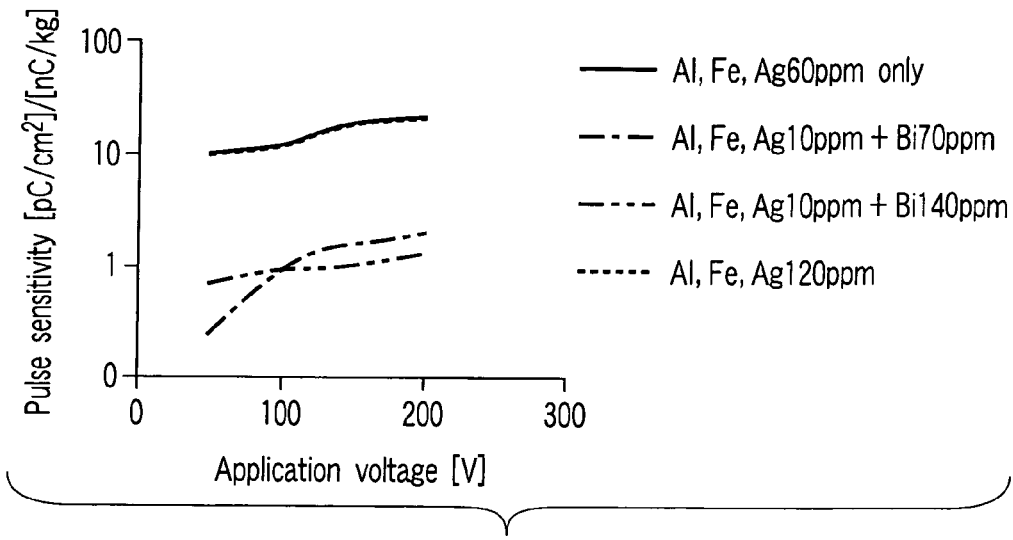
FIG. 1 represents a graph showing impurity-containing pulse sensitivity dependency of a photoelectric converting layer of a radiation detector of one embodiment of the present invention.
Figure 2:
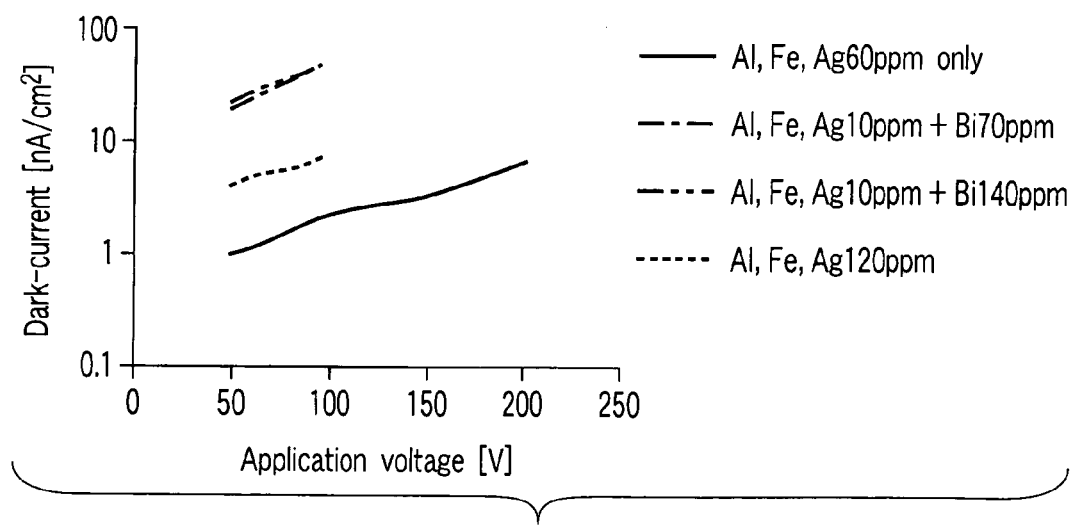
FIG. 2 represents a graph showing impurity-containing dark-current dependency of the photoelectric converting layer of the radiation detector.

At this time, as for the effect of impurities in the photoconductive layer 31, even in the case elements such as iron (Fe), aluminum (Al), and silver (Ag) are contained as shown in FIG. 1, there is no adverse effect especially to the sensitivity characteristic, and in the case, for example bismuth (Bi) is contained in the photoconductive layer 31, the sensitivity characteristic becomes significantly deteriorated. Moreover, also regarding the adverse effect to the dark-current characteristic, the dark-current characteristic is larger than the sensitive characteristic by about single-digit in the photoconductive layer 31 in which bismuth is contained as shown in FIG. 2.

Namely, as shown in FIG. 6A to FIG. 10, when elements belonging to the families neighboring to lead, belonging to the family before and after this lead, and belonging to families neighboring to the family in the periodic table, such as thallium (Tl), indium (In), and tin (Sn) were contained by not less than 10 wtppm, characteristic deteriorations such as reduction in the sensitivity and increase in the dark-current have been significantly found. Accordingly, without being limited to lead iodide, the same effect regarding the impurities has been observed even in mercury iodide ($HgI_2$), indium iodide (InI), bismuth iodide ($BiI_3$), and thallium iodide (TlI).

As these results, the improved results of the photoconductive layer 31 as described above have been similar even if dose and irradiation condition of other X-rays were changed. Moreover, even if the X-ray photoconductive materials constituting the photoconductive layer 31 are mercury iodide, indium iodide, bismuth iodide, thallium iodide, and thallium bromide (TlBr), these results showed similar tendencies which, accordingly are considered to have a common phenomenon regarding the photoconductive layer 31 of the heavy metal halide base. Further, in the case the X-ray photoconductive material constituting the photoconductive layer 31 are two or more kinds of composite system, and even in the case, for example lead iodide and mercury iodide were film-formed by binary vapor-deposition, similar effects have been recognized.

According to the present invention, since respective changes of the dark-current characteristic, the sensitivity characteristic, and the afterimage characteristic in the photoelectric converting layer irradiated with the radiation can be suppressed, the detecting sensitivity and the stability in this photoelectric converting layer can be improved since at least one or more kinds of heavy metal halide ($AB_n$: A=heavy metal, B=halogen, n=either one of 1, 2, and 3), and at least one or more kinds of halogen ($B_2$) are respectively contained in the photoelectric converting layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A radiation detector comprising:
   pixel electrodes which collect charges;
   a photoelectric converting layer which is provided on the pixel electrodes and which converts incident radiation into the charges, and which contains at least one or more kinds of heavy metal halide ($AB_n$:A=heavy metal, B=halogen, n=either one of 1, 2, and 3) and at least one or more kinds of halogen ($B_2$) respectively; and an electrode layer which is provided on the photoelectric converting layer opposite to the pixel electrodes, wherein a molar composition ratio (B/(nA)) of halogen (B) and heavy metal (A) constituting the heavy metal halide in the photoelectric converting layer is 0.9 or more and 1.1 or less.

2. A radiation detector comprising:

pixel electrodes which collect charges;

a photoelectric converting layer which is provided on the pixel electrodes and which converts incident radiation into the charges, and which contains at least one or more kinds of heavy metal halide ($AB_n$: A=heavy metal, B=halogen, n=either one of 1, 2, and 3) and at least one or more kinds of halogen ($B_2$) respectively; and an electrode layer which is provided on the photoelectric converting layer opposite to the pixel electrodes, wherein in the photoelectric converting layer, respective contents of elements belonging to families neighboring to a heavy metal element constituting the heavy metal halide and families neighboring to the periods before and after the heavy metal element are contained at 10 wtppm or less.

* * * * *